United States Patent
Cha et al.

(10) Patent No.: US 10,873,201 B2
(45) Date of Patent: Dec. 22, 2020

(54) BATTERY MANAGEMENT APPARATUS AND METHOD FOR PROTECTING A LITHIUM IRON PHOSPHATE CELL FROM OVER-VOLTAGE USING THE SAME

(71) Applicant: LG CHEM, LTD., Seoul (KR)

(72) Inventors: Sun-Young Cha, Daejeon (KR); Won-Tae Joe, Daejeon (KR)

(73) Assignee: LG CHEM, LTD., Seoul (KR)

( * ) Notice: Subject to any disclaimer, the term of this patent is extended or adjusted under 35 U.S.C. 154(b) by 144 days.

(21) Appl. No.: 16/314,775

(22) PCT Filed: Dec. 4, 2017

(86) PCT No.: PCT/KR2017/014096
§ 371 (c)(1),
(2) Date: Jan. 2, 2019

(87) PCT Pub. No.: WO2018/124514
PCT Pub. Date: Jul. 5, 2018

(65) Prior Publication Data
US 2019/0157896 A1    May 23, 2019

(30) Foreign Application Priority Data
Jan. 2, 2017   (KR) .......................... 10-2017-0000360

(51) Int. Cl.
| | |
|---|---|
| *H02J 7/00* | (2006.01) |
| *H01M 10/48* | (2006.01) |
| *H01M 10/052* | (2010.01) |
| *H01M 10/44* | (2006.01) |
| *G01R 31/36* | (2020.01) |

(Continued)

(52) U.S. Cl.
CPC .......... *H02J 7/00714* (2020.01); *G01R 31/36* (2013.01); *H01M 10/052* (2013.01);

(Continued)

(58) Field of Classification Search
CPC ............. H02J 7/00714; H02J 7/007182; H02J 7/007184; H02J 7/007192; H02J 7/00;

(Continued)

(56) References Cited

U.S. PATENT DOCUMENTS 6,377,030 B1   4/2002   Asao et al.
6,771,042 B2 *  8/2004   Chen ..................... H02J 7/0071
                                                    320/110

(Continued)

FOREIGN PATENT DOCUMENTS

| JP | 2002-118980 A | 4/2002 |
|---|---|---|
| JP | 2011-18547 A | 1/2011 |

(Continued)

OTHER PUBLICATIONS

International Search Report (PCT/ISA/210) issued in PCT/KR2017/014096, dated Apr. 16, 2018.

*Primary Examiner* — M Baye Diao
(74) *Attorney, Agent, or Firm* — Birch, Stewart, Kolasch & Birch LLP

(57) ABSTRACT

A battery management, including a voltage measuring unit electrically connected to multiple lithium iron phosphate (LFP) cells in an LFP battery, the LFP cells being connected in series, to individually measure voltage of each LFP cell and output a voltage value indicative of the measured voltage, and a control unit configured to output a first signal requesting the start of a charging process of the LFP, and when at least one of the voltage values of the multiple LFP cells outputted from the voltage measuring unit reaches a threshold voltage value while the charging process is performed by the first signal, output a second signal requesting the stop of the charging process and output a third signal requesting the start of a discharging process.

12 Claims, 5 Drawing Sheets

(51) Int. Cl.
*H01M 10/42* (2006.01)
*H01M 10/0525* (2010.01)

(52) U.S. Cl.
CPC ....... *H01M 10/425* (2013.01); *H01M 10/441* (2013.01); *H01M 10/443* (2013.01); *H01M 10/48* (2013.01); *H01M 10/482* (2013.01); *H01M 10/486* (2013.01); *H02J 7/00* (2013.01); *H02J 7/007182* (2020.01); *H02J 7/007184* (2020.01); *H02J 7/007192* (2020.01); *H01M 10/0525* (2013.01)

(58) Field of Classification Search
CPC .... H02J 7/0029; H01M 10/482; H01M 10/48; H01M 10/441; H01M 10/425; H01M 10/486; H01M 10/052; H01M 10/443; H01M 10/0525; H01M 4/5825; H01M 10/44; H01M 2010/4271; H01M 7/00306; H01M 10/4257; G01R 31/36; G01R 31/3842
USPC ......................................... 320/149
See application file for complete search history.

(56) References Cited

U.S. PATENT DOCUMENTS

| | | | |
|---|---|---|---|
| 8,421,409 B2* | 4/2013 | Ichikawa | B60L 53/62 320/108 |
| 9,190,863 B2* | 11/2015 | Park | B60L 53/53 |
| 9,285,812 B2* | 3/2016 | Wibben | G05F 1/46 |
| 9,722,436 B2 | 8/2017 | Shiraishi | |
| 9,917,458 B2 | 3/2018 | Lee et al. | |
| 10,027,134 B2* | 7/2018 | Mei | H02J 7/0047 |
| 2009/0153100 A1* | 6/2009 | Okumura | H02J 7/0014 320/116 |
| 2009/0309547 A1 | 12/2009 | Nakatsuji | |
| 2011/0313613 A1 | 12/2011 | Kawahara et al. | |
| 2015/0006933 A1 | 1/2015 | Park et al. | |
| 2015/0288198 A1 | 10/2015 | Cho et al. | |
| 2019/0072613 A1* | 3/2019 | Schmidt | G01R 31/3835 |
| 2019/0126775 A1* | 5/2019 | Han | B60L 53/80 |

FOREIGN PATENT DOCUMENTS

| | | |
|---|---|---|
| JP | 2016-110917 A | 6/2016 |
| KR | 10-2000-0012125 A | 2/2000 |
| KR | 10-2007-0049315 A | 5/2007 |
| KR | 10-1058682 B1 | 8/2011 |
| KR | 10-2013-0028664 A | 3/2013 |
| KR | 10-2015-0001982 A | 1/2015 |
| KR | 10-2015-0043185 A | 4/2015 |
| KR | 10-2015-0089627 A | 8/2015 |
| KR | 10-2016-0024589 A | 3/2016 |
| KR | 10-2016-0071057 A | 6/2016 |
| KR | 10-2016-0071207 A | 6/2016 |

* cited by examiner

1

BATTERY MANAGEMENT APPARATUS AND METHOD FOR PROTECTING A LITHIUM IRON PHOSPHATE CELL FROM OVER-VOLTAGE USING THE SAME

TECHNICAL FIELD

The present application claims priority to Korean Patent Application No. 10-2017-0000360 filed in the Republic of Korea on Jan. 2, 2017, the disclosures of which are incorporated herein by reference.

The present disclosure relates to a battery management apparatus, and more particularly, to a battery management apparatus and method for protecting lithium iron phosphate cells included in a battery from overvoltage.

BACKGROUND ART

Batteries can be repeatedly charged and discharged, and thus they are used as a source of power in various fields. For example, lithium ion batteries area used in handheld devices such as mobile phones, laptop computers, digital cameras, video cameras, tablet computers and electric tools, as well as various types of devices powered with electricity including e-bikes, electric motorcycles, electric vehicles, hybrid electric vehicles, electric ship and electric aircraft.

To stably use various types of devices or systems that are supplied with energy from batteries, accurate information associated with the state of charge (SOC) of the battery is essential. Particularly, the SOC is a parameter indicating how long the battery will be stably usable, and is notified to users in the form of numerical values such as 0~1 or 0%~100% on the basis of design capacity. For example, battery-mounted devices such as laptop computers, mobile phones and vehicles estimate the SOC and provide information associated with the available time converted from the estimated SOC to users.

The SOC of the battery is generally expressed as a percentage of the current remaining capacity to the design capacity at the factory, and in this case, a current integration method (ampere counting) is widely used to determine the SOC.

Meanwhile, a battery may include a plurality of unit cells connected in series, and in practice, charge/discharge characteristics of each unit cell may not be perfectly the same due to a difference in fabrication process, and differences in SOC and the degree of degradation between the unit cells may gradually increase due to the increasing charge/discharge cycles and operating environment for example, temperature. This difference between the unit cells leads to overcharge or overdischarge of a certain cell included in the battery, eventually resulting in overall performance degradation of the battery.

As the related art for solving the above-described problem, Patent Literature 1 (Korean Patent Publication No. 10-2015-0089627) is disclosed, Patent Literature 1 discloses performing cell balancing by discharging a highest voltage cell among multiple cells. However, the cell balancing disclosed by Patent Literature 1 has limitation in that the technology is unsuitable for lithium iron phosphate cells (hereinafter referred to as 'LFP cells'). An LFP cell is a battery cell using lithium iron phosphate ($Li_xFePO_4$) as an active material of the positive electrode. The LFP cell has a long life advantage.

As can be seen from FIG. 1, in the case of an LFP cell, changes in open circuit voltage (OCV) are noticeably smaller during an optimum use range (e.g., SOC 30%~95%) than other types of cells. Specifically, FIG. 1 schematically illustrates OCV-SOC curves of each of a lithium ion cell and an LFP cell shown in previous experiments performed while maintaining a predefined temperature. The line marked with ◆ in FIG. 1 shows the OCV-SOC curve of the lithium ion cell using $LiCoO_2$ for the positive electrode and the line marked with ● shows the OCV-SOC curve of the LFP cell using $LiFePO_4$ for the positive electrode, and the LFP cell has little change in OCV within the SOC range except the end of charge and the end of discharge. That is, OCV of the LFP cell is almost constantly maintained during the most of SOC ranges and sharply increases when SOC reaches a point very close to 100%, making it difficult to find an overvoltage sign of the LFP cell before reaching the corresponding point.

Additionally, due to a hardware limitation of a circuit for cell balancing, the maximum allowable magnitude of a balancing current during discharging of a certain cell is very small, and in some instances, it takes a few hours to reduce SOC by 1%. Accordingly, a cell balancing circuit is used, but nevertheless, in fact, it is impossible to quickly discharge an LFP cell having a sharp increase in OCV near the upper limit of charge voltage, eventually causing an irreversible damage of the LFP cell.

DISCLOSURE

Technical Problem

The present disclosure is designed under the background of the related art as described above, and therefore, the present disclosure is directed to providing an apparatus and method for protecting a lithium iron phosphate (LFP) cell from overvoltage in which a discharging process starts when an overvoltage risk sign is found in a voltage value of at least one of multiple LFP cells connected in series within an LFP battery during a charging process, in view of the characteristics of rapid voltage rise near SOC 100% as can be seen through the charge curve of the LFP cell.

Additionally, the present disclosure is further directed to providing an apparatus and method for determining a threshold voltage value to determine if an LFP cell has an overvoltage risk, taking into account the delay time of a power system.

Additionally, the present disclosure is further directed to providing an apparatus and method for determining whether to stop a discharging process based on the partial discharge capacity calculated through ampere counting from the end of the charging process.

Technical Solution

To achieve the object, a battery management apparatus according to an aspect the present disclosure includes a voltage measuring unit electrically connected to multiple lithium iron phosphate (LFP) cells in a LFP battery, the LFP cells being connected in series, to individually measure voltage of each LIT cell and output a voltage value indicative of the measured voltage, and a control unit configured to output a first signal requesting the start of a charging process of the LFP battery, and when at least one of the voltage values of the multiple LFP cells outputted from the voltage measuring unit reaches a threshold Mage value while the charging process is performed by the first signal, to output a second signal requesting the stop of the charging process and output a third signal requesting the start of a discharging process. In this instance, the charging process is designed to increase a voltage supplied to the LFP battery stepwise from a preset initial target charge voltage value to a final target charge voltage value. In addition, the discharging process is designed to reduce the voltage supplied to the LFP battery stepwise from a preset initial target discharge voltage value to a final target discharge voltage value.

Additionally, the initial target charge voltage of the charging process is larger than the initial target discharge voltage of the discharging process.

Additionally, the control unit may be configured to determine the threshold voltage value by subtracting a voltage margin value corresponding to a delay time from a preset upper limit of charge voltage value of the LFP cell.

Additionally, the control unit may be configured to determine the delay time based on at least one of a first elapsed time and a second elapsed time. In this instance, the first elapsed time may be a period from an output time of the first signal to a start time of the charging process by the first signal, and the second elapsed time may be a period from an output time of the third signal to a start time of the discharging process by the third signal.

Additionally, the battery management apparatus may further include a current measuring unit configured to measure a current of the LFP battery, and output a current value indicative of the measured current. In this case, the control unit may be configured to calculate partial discharge capacity of the LFP battery by integrating the current value outputted from the current measuring unit over time from the time the discharging process starts. Subsequently, the control unit may be configured to output a fourth signal requesting the stop of the discharging process when the partial discharge capacity reaches a discharge reference ratio to remaining capacity of the LFP battery at the time the charging process is stopped. Preferably, the discharge reference ratio may be 3%.

Additionally, the control unit may be configured to output a fifth signal requesting the rise of voltage supplied to the LFP battery each time the current of the LFP battery reaches a first threshold current value during the charging process.

Additionally, the control unit may be configured to output a sixth signal requesting the drop of voltage supplied to the LFP battery each time the current of the LFP battery reaches a second threshold current value during the discharging process.

Additionally, the discharging process may start after the voltage supplied to the LFP battery reduces in accordance with a predefined slew rate from a voltage value at the time the charging process is stopped by the second signal to the initial target discharge voltage value.

According to another aspect of the present disclosure, there is provided a batter pack including the battery management apparatus.

A method according to still another aspect of the present disclosure is for protecting an LFP cell included in LFP battery from overvoltage using the battery management apparatus. The method includes outputting a first signal requesting the start of a charging process of the LFP battery, outputting a end signal requesting the stop of the charging process when at least one of voltage values of multiple LFP cells reaches a threshold voltage value while the charging process is performed by the first signal, and outputting a third signal requesting the start of a discharging process after the charging process is stopped by the second signal. In this case, the charging process is designed to increase the voltage supplied to the LFP battery stepwise from a preset initial target charge voltage value to a final target charge voltage value, and the discharging process is designed to reduce the voltage supplied to the LFP battery stepwise from a preset initial target discharge voltage value to a final target discharge voltage value.

Advantageous Effects

According to at least one of the embodiments of the present disclosure, when an overvoltage risk sign is found in a voltage value of at least one of multiple LFP cells connected in series within an LFP battery, the LFP cell can be protected from overvoltage by starting a discharging process.

Additionally, a threshold voltage value for determining if the LFP cell has an overvoltage risk may be determined, taking into account the delay time of a power system. Accordingly, as the threshold voltage value is adaptively adjusted to the delay time, overvoltage of the LFP cell can be prevented more effectively than the case of the fixed threshold voltage value.

Additionally, determination as to whether to stop a discharging process may be made based on the partial discharge capacity calculated through ampere counting from the time the charging process was terminated due to the overvoltage risk sign found in at least one LFP cell. Accordingly, overdischarge of the LFP battery can be prevented.

BRIEF DESCRIPTION OF THE DRAWINGS

The accompanying drawings illustrate an embodiment of the present disclosure and together with the following detailed description, serve to provide a further understanding of the technical aspects of the present disclosure, and thus, the present disclosure is not construed as being limited to the statements in the drawings.

MODE FOR CARRYING OUT THE INVENTION

Figure 1:
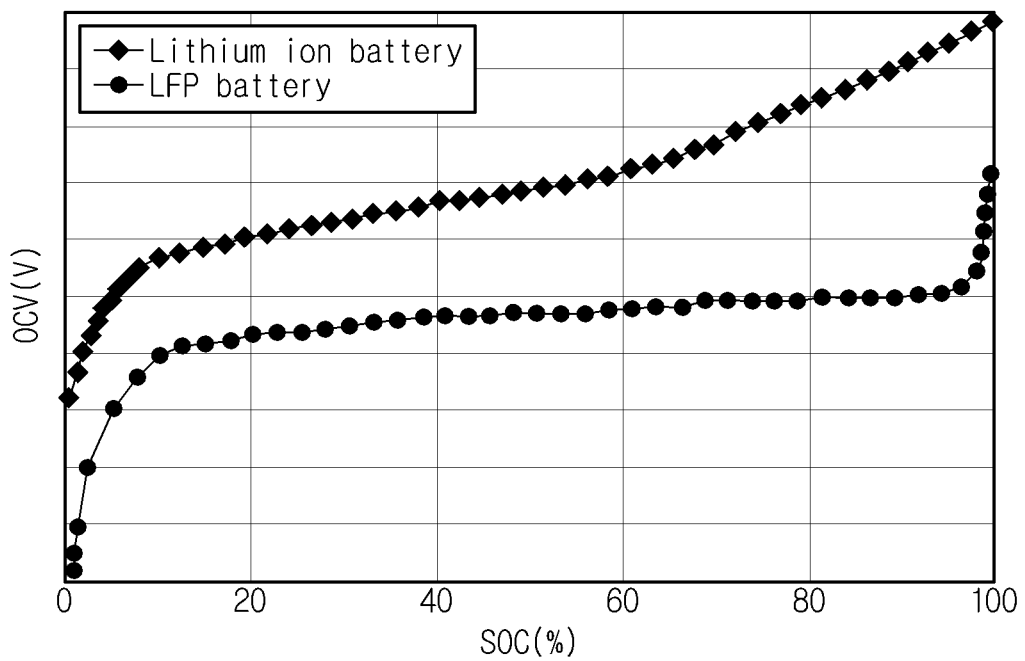
FIG. 1 is a schematic graph showing an open circuit voltage (OCV)-state of charge (SOC) curve for identifying the characteristics of a lithium iron phosphate (LFP) battery.

Hereinafter, embodiments of the present disclosure will be described reference to the accompanying drawings. Prior to the description, it should be understood that the terms or words used in the specification and the appended claims should not be construed as limited to general and dictionary meanings, but interpreted based on the meanings and concepts corresponding to the technical aspects of the present disclosure on the basis of the principle that the inventor is allowed to define terms appropriately for the best explanation. Therefore, the embodiments described herein and illustrations shown in the drawings are just an embodiment of the present disclosure, but not intended to fully describe the technical aspects of the present disclosure, so it should be understood that other equivalents and modifications could be made thereto at the time the invention was made.

In the embodiments described below, a lithium iron phosphate (LFP) battery may refer to an LFP cell including an assembly of positive electrode/separator/negative electrode and an electrolyte in a packaging, as well as an assembly including LFP cells connected in series or parallel. The LFP battery may be included in a battery pack, together with a battery management apparatus 100 described below.

Figure 2:
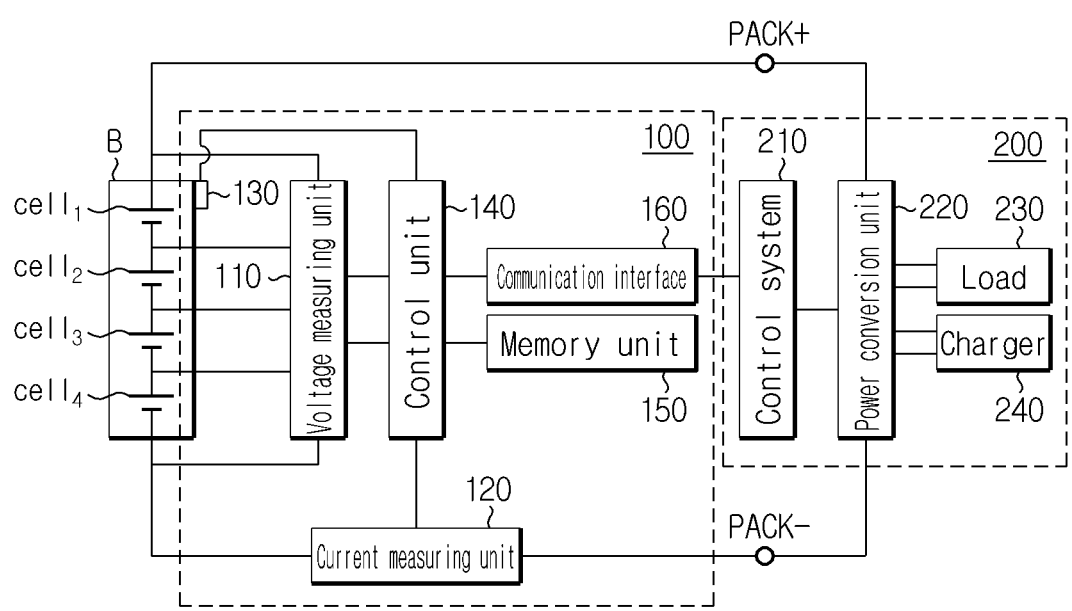
FIG. 2 is a block diagram of a power system according to an embodiment of the present disclosure.

FIG. 2 is a block diagram of a power system according to an embodiment of the present disclosure.

Referring to FIG. 2, the power system according to an embodiment of the present disclosure includes a battery management apparatus 100 and a load device 200.

The battery management apparatus 100 includes a voltage measuring unit 110, a current measuring unit 120 and a control unit 140, and optionally, may further include a temperature measuring unit 130.

The apparatus 100 is configured to perform control to protect an LFP battery B as well as each LFP cell included therein from overvoltage by adjusting a process related to charge and discharge of the LFP battery B when a preset condition is satisfied.

The LFP battery B is electrically connected to the load device 200 through a high potential terminal (PACK+) and a low potential terminal (PACK−). The load device 200 refers to a device that operates with power outputted from the LFP battery B or operates to charge the LFP battery B to the required voltage. For convenience of description, it is hereinafter assumed that the LFP battery B includes four LFP cells $cell_1$~$cell_4$ connected in series as shown in FIG. 2. The LFP cells included in the LFP battery B may be manufactured with the same electrical and chemical property and physical specification. For example, each LFP cell may be designed with the upper limit of charge voltage value of 3.7V.

The load device 200 includes a control system 210, a power conversion unit 220 and a load 230. Optionally, the load device 200 may further include a charger 240. The charger 240 may supply a charge current for charging the LFP battery B to the LFP battery B through the power conversion unit 220. The charger 240 may produce a charge current itself, and may produce a charge current by receiving power from a commercial power source.

In a preferred example, the load 230 may be a motor included an electric vehicle or a hybrid electric vehicle, and the power conversion unit 220 may be an inverter capable of bi-directional power conversion.

The control system 210 is a computing system that controls the overall operation of the load device 200. Particularly, the control system 210 may control the charge and discharge of the LFP battery B using the output parameter of the LFP battery B provided by the control unit 140. For example, the load device 200 may supply constant voltage having predefined level to the LFP battery B based on the output parameter of the LFP battery B provided by the control unit 140. By the constant voltage supplied by the load device 200, each LFP cell included in the LFP battery B may be charged or discharged.

The power conversion unit 220 transmits the discharge output of the LFP battery B to the load 230. In this instance, the power conversion unit 220 may adjust the extent of power conversion so that the LFP battery B may be discharged in the range of the output parameter under the control of the control system 210.

On the contrary, the power conversion unit 220 may transmit the charge output supplied from the charger 240 to the LFP battery B. In this instance, the power conversion unit 220 may adjust the extent of power conversion so that the LFP battery B may be charged in the range of the output parameter under the control of the control system 210.

The apparatus 100 according to the present disclosure may further include a memory unit 150. The memory unit 150 is not limited to a particular type of storage medium when it can record and delete information. For example, the memory unit 150 may include RAM, ROM, register, hard disk, an optical recording medium or a magnetic recording medium.

The memory unit 150 may be electrically connected to the control unit 140 through, for example, a data bus, to allow the control unit 140 to access it.

Additionally, the memory unit 150 stores and/or updates and/or deletes and/or transmits programs including various types of control logics executed by the control unit 140, and/or data created when the control logic is executed.

The memory unit 150 can be logically divided into two or more, and may be included in the control unit 140 without limitations.

The voltage measuring unit 110 is electrically coupled with the control unit 140 to transmit and receive electrical signals. The voltage measuring unit 110 measures the voltage applied between the positive electrode and the negative electrode of the LFP battery B at a time interval under the control of the control unit 140 and outputs a voltage value indicative of the measured voltage to the control unit 140. Additionally, the voltage measuring unit 110 may measure the voltage applied to two ends of each LFP cell included in the LFP battery B, and output a voltage value indicative of the measured voltage from each LFP cell to the control unit 140. To this end, the voltage measuring unit 110 may be electrically connected to the positive electrode and the negative electrode of each LFP cell through multiple sensing lines.

The control unit 140 stores the voltage value of the LFP battery B and the voltage value of each LFP cell outputted from the voltage measuring unit 110 in the memory unit 150. For example, the voltage measuring unit 110 may include a voltage sensor commonly used in the art.

The current measuring unit 120 is electrically coupled with the control unit 140 to transmit and receive electrical signals. The current measuring unit 120 measures the current flowing through the LFP battery B at a time interval under the control of the control unit 140 and outputs a current value indicative of the measured current to the control unit 140. The control unit 140 stores the current value outputted from the current measuring unit 120 in the memory unit 150. For example, the current measuring unit 120 may include a hall sensor or a sense resistor commonly used in the art. The control unit 140 may determine whether the LFP battery B is being charged or discharged or the LFP battery B is in non-use based on the symbol of the current value outputted from the current measuring unit 120.

The temperature measuring unit 130 is electrically coupled with the control unit 140 to transmit and receive electrical signals. The temperature measuring unit 130 measures the temperature of the LFP battery B at a time interval and outputs a temperature value indicative of the measured temperature to the control unit 140. The control unit 140 stores the temperature value outputted from the temperature measuring unit 130 in the memory unit 150. For example, the temperature measuring unit 130 may include a thermocouple commonly used in the art.

The apparatus 100 according to the present disclosure may further include a communication interface 160. The communication interface 160 is a component necessary for the control unit 140 to establish communication with the control system 210 included in the load device 200.

The communication interface 160 includes any known communication interface that supports communication between different systems. The communication interface may support wired or wireless communication. Preferably, the communication interface may support controller area network (CAN) communication or daisy chain communication.

The control unit 140 may determine the SOC of the LFP battery B selectively using at least one of the voltage value of the LFP battery B outputted by the voltage measuring unit 110 and the current value of the LFP battery B outputted by the current measuring unit 120 and the temperature value of the LFP battery B outputted by the temperature measuring unit 130. Of course, the control unit 140 may individually determine the SOC of the LFP cells based on the current value of the LFP battery B outputted by the current measuring unit 120 and the voltage value of each LFP cell outputted by the voltage measuring unit 110.

For example, the SOC of the LFP battery B may be a value determined using the ampere counting method. In other words, the control unit 140 may not only continuously monitor the SOC of the LFP battery B but also update the latest determined SOC using the SOC determined at the current time, based on the results of integrating the current value periodically measured through the current measuring unit 120 over time. In the case of using the ampere counting method, the temperature value of the LFP battery B may be used to correct the integrated amount of current.

The control unit 140 monitors the voltage value sequential outputted by the voltage measuring unit 110 and the current value sequentially outputted by the current measuring unit 120. In this instance, the voltage measurement time by the voltage measuring unit 110 and the current measurement time by the current measuring unit 120 may be synchronized with each other. Optionally, the temperature measurement time by the temperature measuring unit 130 may be also synchronized with the voltage measurement time by the voltage measuring unit 110 or the current measurement time by the current measuring unit 120. Additionally, the control 140 may store, in the memory unit 150, a predefined number of voltage values and a predefined numbers current values respectively outputted from the voltage measuring unit 110 and the current measuring unit 120 for a predefined period in the past from the present time.

Figure 3:
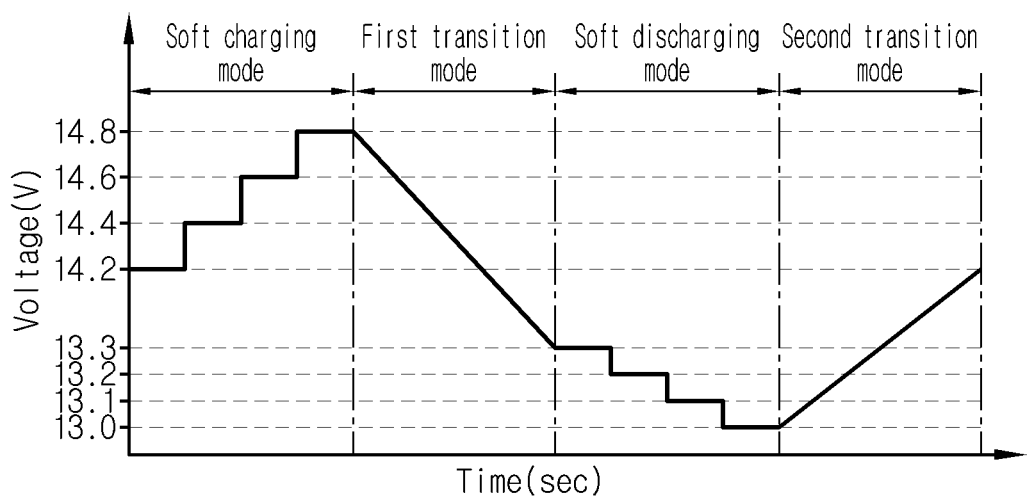
FIG. 3 is a graph for reference describing a correlation between many operating modes of a battery management apparatus according to an embodiment of the present disclosure.

FIG. 3 is a graph for reference in describing a correlation between many operating modes of the battery management apparatus 100 according to an embodiment of the present disclosure.

As can be seen through FIG. 3, the battery management apparatus 100 may operate at least in soft charging mode and soft discharging mode. Optionally, the control unit 140 may operate in a first transition mode during at least part of the whole period from the end time of soft charging node to a time before the start of soft discharging mode. Additionally, the control unit 140 may operate a second transition mode during at least part of the period from the end time of soft discharging mode to a time before the start of soft charging mode, which is different from the first transition mode.

First, the soft charging mode will be described.

<Soft Charging Mode>

When the control unit 140 enters a soft charging mode, the control unit 140 outputs a signal requesting the start of a preset charging process. The signal requesting the start of the charging process may be transmitted to the load device 200. The charging process may be a process designed to increase the voltage supplied from the load device 200 to the LFP battery B stepwise from a preset initial target charge voltage value to a final target charge voltage value. The final target charge voltage value may be preset in consideration of the number of LFP cells $cell_1$~$cell_4$ connected in series included in the LFP battery B and an upper limit of charge voltage value of each LFP cell. For example, when the upper limit of charge voltage value of each LFP cell is 3.7V and four LFP cells are connected in series, the final target charge voltage value may be 14.8V.

For example, assume that the initial target charge voltage value is 14.2V and the final target charge voltage value is 14.8V as shown in FIG. 3. In this case, starting from the start of the charging process until a predefined voltage rise condition is satisfied, constant voltage with the initial target charge voltage value of 14.2V may be supplied to the LFP battery B. When the voltage rise condition is satisfied during the supply of constant voltage of 14.2V to the LFP battery B, constant voltage higher than 14.2V may be supplied to the LFP battery B. Here, constant voltage higher than 14.2V may be a final target charge voltage value 14.8V or have a level between 14.2V and 14.8V. For example, in the charging process, each time the voltage rise condition is satisfied, voltage supplied to the LFP battery B may be increased by a preset value (e.g., 0.2V) using the final target charge voltage value as the upper limit.

The voltage rise condition is that the current value from the current measuring unit 120 reaches a preset first threshold current value. When it is assumed that the current value from the current measuring unit 120 is a positive number while the charge current of the LFP battery B is flowing, the first threshold current value may be also preset to be a positive number. For example, when the current value from the current measuring unit 120 gradually reduces and reaches 1.5A set as the first threshold current value while constant voltage of first level is supplied to the LFP battery B according to the charging process, constant voltage of second level higher than the first level may be supplied to the LFP battery B according to the charging process. If the first level is the final target charge voltage value, the charging process may automatically end.

The current value (e.g., 1.3A) of charge current being equal to or smaller than the first threshold current value 1.5A while constant voltage of specified level is supplied to the LFP battery B represents that the voltage of the LFP battery B is charged on a similar level to the corresponding constant voltage of specified level. Accordingly, the control unit 140 may determine it the voltage rise condition is satisfied to supply constant voltage of next level belonging to the charging process to the LFP battery B or terminate the charging process. In this instance, the first threshold current value may be pre-determined to be an optimum value in consideration of a measurement error of the current measuring unit 120.

During the charging process, i.e., from the start time of the charging process to the end time, the control unit 140 may individually monitor the voltage values of the LFP cells $cell_1$~$cell_4$ included in the LFP battery B, and may periodically determine if at least one of the voltage values being monitored reaches a threshold voltage value. When at least one of the voltage values being monitored reaches the threshold voltage value during the charging process, the control unit 140 may output a signal requesting the stop of the charging process. Along with this or separately, the control unit 140 may store data representing the SOC of the LFP battery B at the time the signal requesting the stop of the charging process is outputted, i.e., the current or latest determined remaining capacity in the memory unit 150.

Here, the threshold voltage value is a value that is lower than the preset upper limit of charge voltage value of the LFP cell, and may be determined in consideration of a delay time. In this instance, the delay time may be the total elapsed time from the time a specified signal is transmitted from the power system to the time a function designated by the corresponding specified signal is executed. The control unit 140 may determine the threshold voltage value by subtracting a voltage margin value corresponding to the delay time from the upper limit of charge voltage value. The voltage margin value may be a parameter that is proportional to the delay time, and in this case, as the delay time increases, the threshold voltage value reduces, and on the contrary, as the delay lime reduces, the threshold voltage value increases.

When the charging process is actually stopped by the signal requesting the stop of the charging process, the control unit 140 may cancel the soft charging mode.

After the soft charging mode is cancelled, the control unit 140 may enter the soft discharging mode immediately, or may enter the soft discharging mode through the first transition mode. Hereinafter, the soft discharging mode will be described first and then a description of the first transition mode will follow.

<Soft Discharging Mode>

When the control unit 140 enters the soft discharging mode, the control unit 140 outputs a signal requesting the start of a preset discharging process. The signal requesting the start of the discharging process may be transmitted to the load device 200. The discharging process may be a process designed to reduce the voltage supplied from the load device 200 to the LFP battery B stepwise from a preset initial target discharge voltage value.

For example, assume that the initial target discharge voltage value is 13.3V and a final target discharge voltage value is 13.0V as shown in FIG. 3. In this case, starting from the start of the discharging process until a predefined voltage drop condition is satisfied, constant voltage with the initial target discharge voltage value of 13.3V may be supplied to the LFP battery B. When the voltage drop condition is satisfied during the supply of constant voltage of 13.3V to the LFP battery B, constant voltage lower than 13.3V may be supplied to the LFP battery B. Here, constant voltage lower than 13.3V may be the final target discharge voltage value 13.0V, or have a level (e.g., 13.2V, 13.1V) between 13.3V and 13.0V. For example, in the discharging process, the voltage supplied to the LFP battery B may be lowered by a preset value (e.g., 0.1V) each time the voltage drop condition is satisfied.

According to circumstances, a lower limit value of voltage supplied to the LFP battery B, i.e., the final target discharge voltage may not be preset in the discharging process.

The voltage drop condition is that the current value from the current measuring unit 120 reaches a preset second threshold current value. When it is assumed that the current value from the current measuring unit 120 is a negative number while the discharge current of the LFP batters B is flowing, the second threshold current value may be also preset to be a negative number. For example, when the current value from the current measuring unit 120 gradually increases and reaches −1.5A set to be the second threshold current value while constant voltage of third level is supplied to the LFP battery B according to the discharging process, constant voltage of fourth level lower than the third level may be supplied to the LFP battery B according to the discharging process. When the third level is the final target discharge voltage value, the discharging process may automatically end.

The current value (e.g., −1.4A) of discharge current being equal to or larger than the second threshold current value −1.5A while constant voltage of specified level is supplied to the LFP battery B represents that the voltage of the LFP battery B is discharged on a similar level to the corresponding constant voltage of specified level. Accordingly, the control unit 140 may determine if the voltage drop condition is satisfied to supply constant voltage of next level belonging to the discharging process to the LFP battery B or terminate the discharging process. In this instance, the second threshold current value may be pre-determined to be an optimum value in consideration of a measurement error of the current measuring unit 120 in the same way as the first threshold current value.

During the discharging process, i.e., from the start time of the discharging process to the end time, the control unit 140 may monitor the current value from the current measuring unit 120, and calculate partial discharge capacity which is a resulting value of integrating the current values being monitored over time. The partial discharge capacity may be, for example, a parameter of 'ampere hour (Ah)' unit. When the partial discharge capacity reaches a discharge reference ratio to the remaining capacity of the LFP battery B at the time the charging process is stopped last, the control unit 140 may output a signal requesting the stop of the discharging process. For example, when it is assumed that the remaining capacity of the LFP battery B at the time the charging process is stopped last corresponds to SOC 90%, if the partial discharge capacity is equal to or larger than the capacity corresponding to SOC 2.7% which is 3% of SOC 90%, the control unit 140 may output a signal requesting the stop of the discharging process.

Here, the discharge reference ratio is a parameter for preventing the overvoltage of the LFP cell and preventing the LFP battery B from being overdischarged more than necessary, and may be determined in consideration of the charge curve of the LFP cell. For example, when SOC at the start of a rapid change in OCV (e.g., a voltage change ratio is equal to or larger than a specified value) on the charge curve of the LFP cell is 97%, the discharge reference ratio may be determined to be equal to 3% which is a difference with 100% which is SOC corresponding to full charge.

When the discharging process is actually stopped by the signal requesting the stop of the discharging process, the control unit 140 may cancel the soft charging mode.

Prior to description of the transition mode, determination of the delay time previously described will be described in detail. According to an embodiment, the control unit 140 may determine a first elapsed time from the output time of the signal requesting the start of the charging process to the start time of the charging process as the delay time. According to another embodiment, the control unit 140 may determine a second elapsed time from the output time of the signal requesting the start of the discharging process to the start time of the discharging process as the delay time. According to still another embodiment, the control unit 140 may determine an average of the first elapsed time and the second elapsed time as the delay time based on the first elapsed time and the second elapsed time. Of course, it is not excluded that the delay time may have a fixed value preset through previous experimentation.

<Transition Mode>

In the present disclosure, the transition mode may be classified into a first transition mode and a second transition mode.

At least from the point in time in which the charging process is stopped by a signal requesting the stop of the charging process or thereafter until the discharging process starts, the control unit 140 operates in first transition mode. The first transition mode is a mode for stably dropping the voltage supplied to the LFP battery B from the voltage value at the point in time in which the charging process is stopped to the initial target discharge voltage value. Accordingly, a maximum value to which the voltage value may drop during the first transition mode may be equal to a value obtained by subtracting the initial target discharge voltage value from the final target charge voltage value. For example, in the case of FIG. 3, the maximum value to which the voltage value may drop during the first transition mode is 1.5V.

To this end, a predefined first slew rate associated with the first transition mode may be preset and stored in the memory unit 150. In the present disclosure, the first slew rate is a parameter defining a drop rate of voltage supplied to the LFP battery B. That is, in the first transition mode, voltage supplied to the LFP battery B continuously reduces along the first slew rate.

For example, as in FIG. 3, when the voltage value of constant voltage supplied to the LFP battery B and the first slew rate at the time the charging process is stopped are 14.8V and −0.1V/12 sec respectively, the control unit 140 will operate in first transition mode for 180 seconds in total. Here, 180 seconds is a value that can be known from '(13.3V-14.8V)÷the first slew rate'.

Meanwhile, when re-start of the charging process is required after the discharging process is stopped last, the control unit 140 may operate in second transition mode in which the voltage supplied to the LFP battery B rises to the initial target charge voltage value according to a second slew rate (e.g., +0.1V/5 sec) having the opposite symbol to the first slew rate as shown in FIG. 3.

Figure 4:
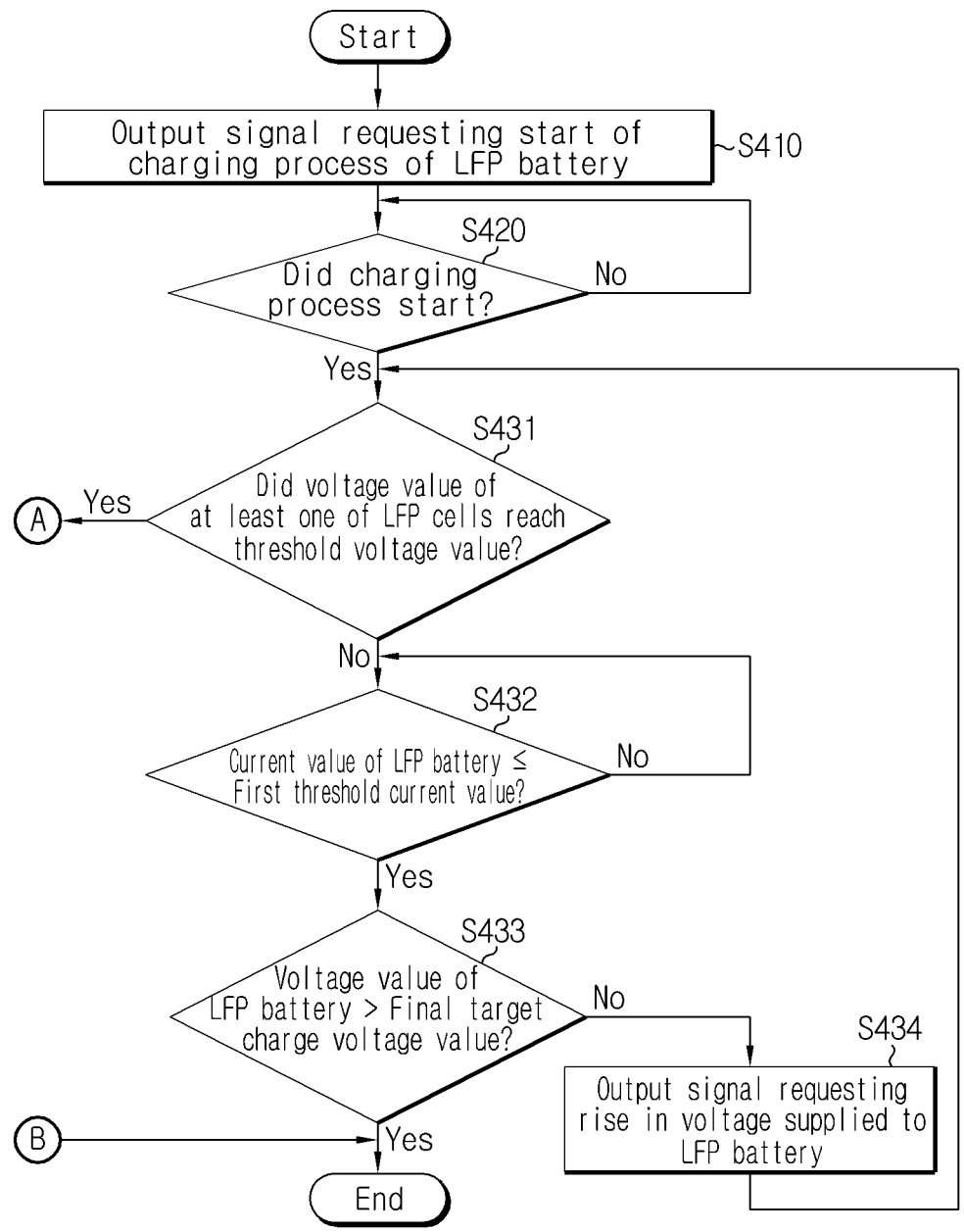
FIGS. 4 and 5 are flowcharts showing the steps of a method for protecting cell from over voltage according to an embodiment of the present disclosure.
Figure 5:
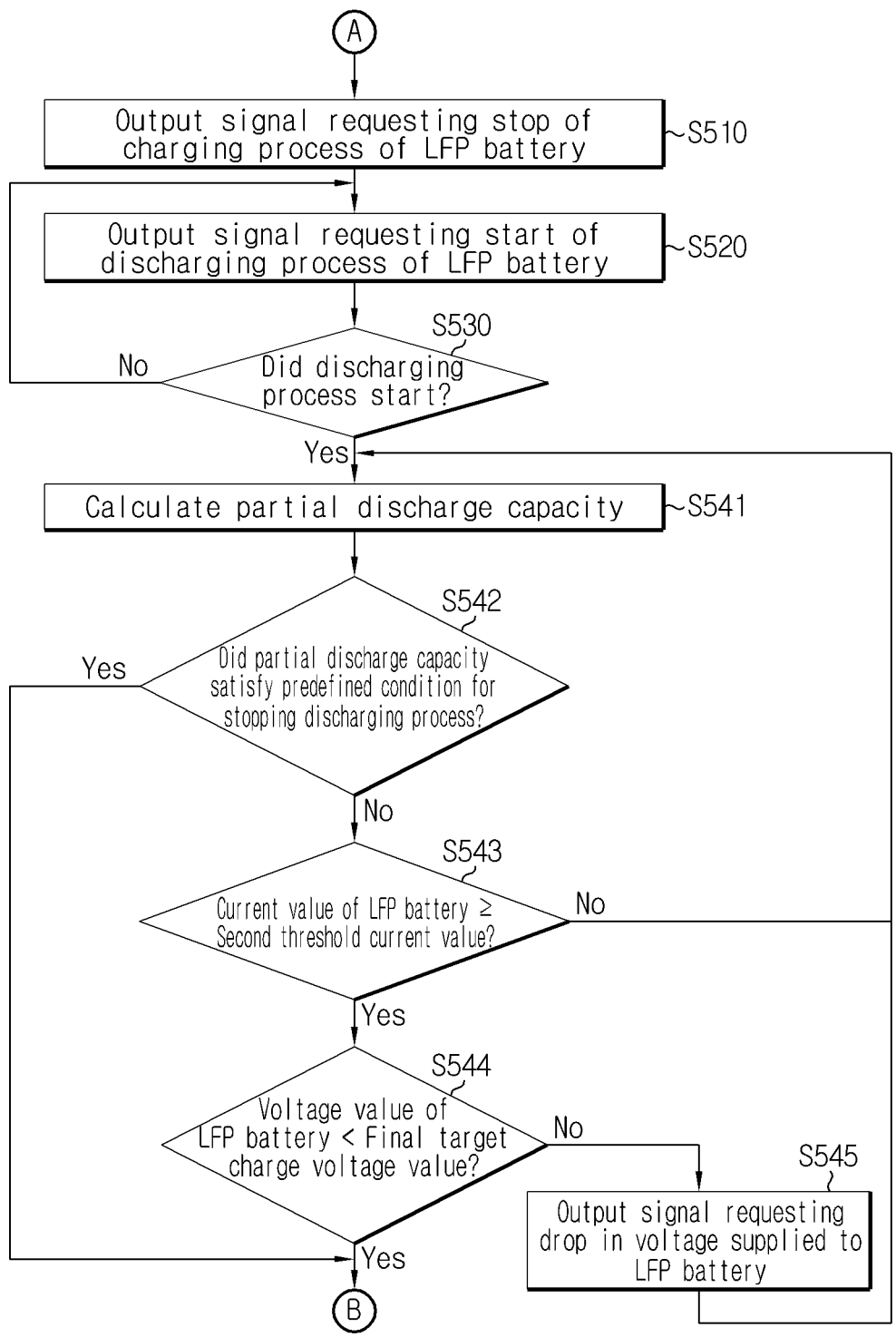

FIGS. 4 and 5 are flowcharts showing the steps of a method for protecting a LFP cell from overvoltage according to an embodiment of the present disclosure. In relation to FIGS. 4 and 5, for convenience of description, it is assumed that the charging process at least includes constant voltage ranges of initial target charge voltage value and final target charge voltage value, and the discharging process at least includes constant voltage ranges of initial target discharge voltage value and final target discharge voltage value. Of course, at least one of the charging process and the discharging process may include at least two constant voltage ranges, and according to embodiments, may include at least three constant voltage ranges.

First, referring to FIG. 4, in S410, the control unit 140 outputs a signal requesting the start of the charging process of the LFP battery B. The signal outputted through S410 is transmitted to the load device 200 through the interface unit 160 inducing the load device 200 to start the charging process. The charging process is designed to increase voltage supplied to the LFP battery stepwise from a preset initial target charge voltage value to a final target charge voltage value.

In S420, the control unit 140 determines if the charging process has started by the signal outputted through S410. For example, when b voltage value indicative of voltage applied to two ends of the LFP battery B outputted from the voltage measuring unit 110 is equal to the initial target charge voltage value, the control unit 140 may determine that the charging process has started. In the present disclosure, a value being equal to another value may represent not only that the two values are perfectly the same, but also that a difference between the two values is in a predefined allowed range. If the determination result of S420 is "YES", the control unit 140 moves to S431.

In S431, the control unit 140 enters the soft charging mode and determines if a voltage value of at least one LFP cells $cell_1$~$cell_4$ reached the threshold voltage value while constant voltage from the initial target charge voltage value is supplied to the LFP battery B.

When the determination result of S431 is "NO", the control unit 140 moves to S432. When the determination result of S431 is "YES", the control unit 140 moves to S510.

In S432, the control unit 140 determines if the current value of the LFP battery B reached the first threshold current value. When the determination result of S432 is "YES", the control unit 140 moves to S433.

In S433, the control unit 140 determines if the voltage value of the LFP battery B exceeds the final target charge voltage value. This is for preventing the whole overcharge of the LFP battery B during the charging process.

When the determination result of S433 is "NO", the control unit 140 moves to S434. When the determination result of S433 is "YES", the control unit 140 may terminate the process or start the second transition mode.

In S434, the control unit 140 outputs a signal requesting the rise of voltage supplied to the LFP battery B. That is, the control unit 140 outputs a signal requesting the rise of voltage supplied to the LFP battery B to the next constant voltage. After performing S434, the control unit 140 may return to S431.

Subsequently, referring to FIG. 5, in S510, the control unit 140 outputs a signal requesting the stop of the charging process of the LFP battery B. The signal outputted through S510 is transmitted to the load device 200 through the interface unit 160, inducing the load device 200 to stop the charging process.

In S520, when the charging process is terminated by the signal outputted through S410, the control unit 140 outputs a signal requesting the start of the discharging process. Of course, the control unit 140 may operate in first transition mode between S510 and S211.

In S530, the control unit 140 determines if the discharging process has started by the signal outputted through S520. For example, when a voltage value indicative of voltage applied to two ends of the LFP battery B outputted from the voltage measuring unit 110 is equal to the initial target discharge voltage value, the control unit 140 may determine that the discharging process has started. When the determination result of S530 is "YES" the control unit 140 moves to S541.

In S541, the control unit 140 calculates partial discharge capacity from the entry time to the soft discharging mode.

In S542, the control unit 140 determines if the partial discharge capacity satisfies a predefined condition for stop of the discharging process. Here, the discharging process stop condition is that the partial discharge capacity reaches a discharge reference ratio (e.g., 3%) to the remaining capacity of the LFP battery at the stop time of the charging process.

When the determination result of S542 is "NO", the control unit 140 moves to S543. When the determination result of S542 is "YES", the control unit 140 may terminate the process or start the second transition mode.

In S543, the control unit 140 determines if the current value of the LFP battery B reached the second threshold current value.

When the determination result of S543 is "YES", the control unit 140 moves to S544. When the determination result of S543 is "NO", the control unit 140 may return to S541.

In S544, the control unit 140 determines if the voltage value of LFP battery B is less than the final target discharge voltage value. This is for preventing the LFP battery B from being unnecessarily overdischarged in the process for protecting at least one LFP cell from overvoltage.

When the determination result of S544 is "NO", the control unit 140 moves to S545. When the determination result of S544 is "YES", the control unit 140 may terminate the process or start the second transition mode.

In S54S, the control unit 140 outputs a signal requesting the drop of the voltage supplied to the LFP battery B. That is, the control unit 140 outputs a signal requesting the drop of the voltage supplied to the LFP battery B to the next constant voltage. After performing S545, the control unit 140 may return to S541.

In describing various embodiments of the present disclosure, it may be understood that the components designated by '~ unit' are elements which are classified functionally rather than physically. Accordingly, each component may be selectively combined with other component, or may be divided into subcomponents efficient execution of control logic(s). However, it is obvious to those skilled in the art that even though the components are combined or divided, if functions are recognized as being the same, the combined or divided components should be construed as being in the scope of the present disclosure.

While the present disclosure has been hereinabove described with regard to a limited number of embodiments and drawings, the present disclosure is not limited thereto and it should be understood that various modifications and changes may be made by those skilled in the art within the technical aspects of the invention and the equivalent scope of the appended claims.

What is claimed is:

1. A battery management apparatus comprising:
   a voltage measuring unit electrically connected to multiple lithium iron phosphate (LFP) cells in a LFP battery, the LFP cells being connected in series, to individually measure a voltage of each LFP cell and output a voltage value indicative of the measured voltage; and
   a control unit configured to:
   output a first signal to a charger requesting the start of a charging process of the LFP battery by the charger, and
   when at least one of the voltage values of the multiple LFP cells outputted from the voltage measuring unit reaches a threshold voltage value while the charging process is performed by the charger due to the first signal, output a second signal to the charger requesting the stop of the charging process and output a third signal to the charger requesting the start of a discharging process,
   wherein the charging process is designed to increase a voltage supplied to the LFP battery stepwise from a preset initial target charge voltage value to a final target charge voltage value, and
   the discharging process is designed to reduce the voltage supplied to the LFP battery stepwise from a preset initial target discharge voltage value to a final target discharge voltage value.

2. The battery management apparatus according to claim 1, wherein the initial target charge voltage of the charging process is larger than the initial target discharge voltage of the discharging process.

3. The battery management apparatus according to claim 1, wherein the control unit is configured to determine the threshold voltage value by subtracting a voltage margin value corresponding to a delay time from a preset upper limit of charge voltage value of the respective LFP cell.

4. The battery management apparatus according to claim 3, wherein the control unit is configured to determine the delay time based on at least one of a first elapsed time and a second elapsed time,
   wherein the first elapsed time is a period from an output time of the first signal to a start time of the charging process by the first signal, and
   wherein the second elapsed time is a period from an output time of the third signal to a start time of the discharging process by the third signal.

5. The battery management apparatus according to claim 1, further comprising:
   a current measuring unit configured to measure a current of the LFP battery, and output a current value indicative of the measured current.

6. The battery management apparatus according to claim 5, wherein the control unit is configured to:
   calculate partial discharge capacity of the LFP battery by integrating the current value outputted from the current measuring unit over time from the time the discharging process starts, and
   output a fourth signal requesting the stop of the discharging process when the partial discharge capacity reaches a discharge reference ratio to remaining capacity of the LFP battery at the time the charging process is stopped.

7. The battery management apparatus according to claim 6, wherein the discharge reference ratio is 3%.

8. The battery management apparatus according to claim 5, wherein the control unit is configured to output a fifth signal requesting the rise of voltage supplied to the LFP battery each time the current of the LFP battery reaches a first threshold current value during the charging process.

9. The battery management apparatus according to claim 5, wherein the control unit is configured to output a sixth signal requesting the drop of voltage supplied to the LFP battery each time the current of the LFP battery reaches a second threshold current value during the discharging process.

10. The battery management apparatus according to claim 1, wherein the discharging process starts after the voltage supplied to the LFP battery reduces in accordance with a predefined slew rate from a voltage value at the time the charging process is stopped by the second signal to the initial target discharge voltage value.

11. A battery pack comprising:
    the battery management apparatus according to claim 1; and
    a load device, the load device including the charger.

12. A method for protecting a lithium iron phosphate (LFP) cell from overvoltage in which an LFP cell included in an LFP battery is protected from overvoltage using a battery management apparatus, the method comprising:
    outputting, by the battery management apparatus, a first signal to a charger requesting the start of a charging process of the LFP battery;
    outputting, by the battery management apparatus, a second signal to the charger requesting the stop of the charging process when at least one of voltage values of multiple LFP cells reaches a threshold voltage value while the charging process is performed by the charger due to the first signal; and outputting, by the battery management apparatus, a third signal to the charger requesting the start of a discharging process after the charging process is stopped by the second signal, wherein the charging process is designed to increase the voltage supplied to the LFP battery stepwise from a preset initial target charge voltage value to a final target charge voltage value, and wherein the discharging process is designed to reduce the voltage supplied to the LFP battery stepwise from a preset initial target discharge voltage value to a final target discharge voltage value.

* * * * *